(12) United States Patent
Hosono et al.

(10) Patent No.: US 7,503,017 B2
(45) Date of Patent: Mar. 10, 2009

(54) METHOD AND PROGRAM FOR LIBRARY GENERATION

(75) Inventors: Toshikatsu Hosono, Kasugai (JP); Katsuhito Hashiba, Kasugai (JP)

(73) Assignee: Fujitsu Microelectronics Limited, Tokyo (JP)

( * ) Notice: Subject to any disclaimer, the term of this patent is extended or adjusted under 35 U.S.C. 154(b) by 436 days.

(21) Appl. No.: 10/963,730

(22) Filed: Oct. 14, 2004

(65) Prior Publication Data

US 2005/0266495 A1      Dec. 1, 2005

(30) Foreign Application Priority Data

May 25, 2004   (JP) .............................. 2004-155086

(51) Int. Cl.
*G06F 17/50* (2006.01)
(52) U.S. Cl. .................... 716/1; 716/5; 716/17
(58) Field of Classification Search ................ 716/1–6, 716/16–18; 703/18–19
See application file for complete search history.

(56) References Cited

U.S. PATENT DOCUMENTS

| 6,028,995 | A  | * | 2/2000 | Jetton et al. .................... 703/19 |
| 2007/0083831 | A1 | * | 4/2007 | Hamilton et al. ................ 716/1 |
| 2008/0163152 | A1 | * | 7/2008 | Kheterpal et al. ............. 716/18 |

FOREIGN PATENT DOCUMENTS

| JP | 2001-168200 | 6/2001 |
| JP | 2002-222232 | 8/2002 |

* cited by examiner

*Primary Examiner*—Paul Dinh
(74) *Attorney, Agent, or Firm*—Staas & Halsey LLP

(57) ABSTRACT

A library generation device determines a characteristic approximation function based on a characteristic extraction table to calculate characteristic data corresponding to a client's conditions in accordance with the characteristic approximation function. A library for verification including the calculated characteristic data and format information of a reference library is generated in the same format as the reference library.

16 Claims, 9 Drawing Sheets

Temperature 0℃
Voltage 0.8v

| slew (ns) | c1 (fF) | | | | | | | |
|---|---|---|---|---|---|---|---|---|
| | 0.001 | 0.004 | 0.012 | 0.033 | 0.123 | 0.41 | 0.984 | |
| 0.012327 | 0.035057 | 0.040743 | 0.05572 | 0.09419 | 0.25741 | 0.776555 | 0.81459 | |
| 0.0786 | 0.069652 | 0.077044 | 0.094886 | 0.13611 | 0.300319 | 0.820304 | 1.85877 | |
| 0.2898 | 0.135686 | 0.149262 | 0.179449 | 0.24008 | 0.429306 | 0.953055 | 1.9909 | |
| 0.5796 | 0.1961 | 0.216209 | 0.260293 | 0.345536 | 0.581213 | 1.13397 | 2.17554 | 26a |
| 1.1784 | 0.281777 | 0.312397 | 0.379815 | 0.506856 | 0.833879 | 1.48266 | 2.54966 | |

Temperature 0℃
Voltage 1.0v

| slew (ns) | c1 (fF) | | | | | | | |
|---|---|---|---|---|---|---|---|---|
| | 0.001 | 0.004 | 0.012 | 0.033 | 0.123 | 0.41 | 0.984 | |
| 0.00994 | 0.022978 | 0.026676 | 0.036669 | 0.062334 | 0.171703 | 0.51965 | 1.21576 | |
| 0.0774 | 0.047453 | 0.05346 | 0.067219 | 0.097584 | 0.209661 | 0.557934 | 1.25336 | |
| 0.2898 | 0.08121 | 0.091796 | 0.115865 | 0.16494 | 0.309757 | 0.671634 | 1.36772 | |
| 0.573 | 0.105596 | 0.119964 | 0.152887 | 0.219872 | 0.407934 | 0.814121 | 1.51938 | 26b |
| 1.2066 | 0.139464 | 0.159232 | 0.204952 | 0.299069 | 0.562771 | 1.07656 | 1.84803 | |

Temperature 0℃
Voltage 1.2v

| slew (ns) | c1 (fF) | | | | | | | |
|---|---|---|---|---|---|---|---|---|
| | 0.001 | 0.004 | 0.012 | 0.033 | 0.123 | 0.41 | 0.984 | |
| 0.010025 | 0.018176 | 0.021216 | 0.029021 | 0.049207 | 0.135434 | 0.410167 | 0.959444 | |
| 0.0762 | 0.035731 | 0.040595 | 0.052204 | 0.077567 | 0.167734 | 0.442783 | 0.992209 | |
| 0.2868 | 0.058715 | 0.066549 | 0.08496 | 0.124271 | 0.245579 | 0.53905 | 1.08968 | |
| 0.5832 | 0.079671 | 0.089593 | 0.11303 | 0.163353 | 0.318298 | 0.658554 | 1.22663 | 26c |
| 1.2378 | 0.113621 | 0.126815 | 0.157649 | 0.223293 | 0.425732 | 0.858698 | 1.50355 | |

Fig.7

Temperature 40°C
Voltage 0.8v

| slew (ns) | cl (fF) | | | | | | |
|---|---|---|---|---|---|---|---|
| | 0.001 | 0.004 | 0.012 | 0.033 | 0.123 | 0.41 | 0.984 |
| 0.012686 | 0.034932 | 0.040541 | 0.055272 | 0.093108 | 0.253242 | 0.763381 | 1.78253 |
| 0.0786 | 0.066547 | 0.074114 | 0.091814 | 0.132678 | 0.294092 | 0.80448 | 1.82252 |
| 0.288 | 0.122688 | 0.13609 | 0.166148 | 0.226778 | 0.415117 | 0.930212 | 1.94882 |
| 0.5784 | 0.170411 | 0.18996 | 0.233414 | 0.318435 | 0.554728 | 1.10274 | 2.12578 |
| 1.1694 | 0.232051 | 0.261087 | 0.325463 | 0.449861 | 0.775803 | 1.42479 | 2.47965 |

— 26d

Temperature 40°C
Voltage 1.0v

| slew (ns) | cl (fF) | | | | | | |
|---|---|---|---|---|---|---|---|
| | 0.001 | 0.004 | 0.012 | 0.033 | 0.123 | 0.41 | 0.984 |
| 0.010852 | 0.023734 | 0.027517 | 0.037691 | 0.063788 | 0.175076 | 0.529102 | 1.23759 |
| 0.0774 | 0.046208 | 0.052391 | 0.066302 | 0.097126 | 0.211324 | 0.565524 | 1.27396 |
| 0.2904 | 0.075994 | 0.086292 | 0.109977 | 0.158972 | 0.306596 | 0.675439 | 1.38352 |
| 0.5712 | 0.096956 | 0.110504 | 0.141969 | 0.207306 | 0.396221 | 0.809723 | 1.52741 |
| 1.1982 | 0.125931 | 0.144143 | 0.186561 | 0.275733 | 0.534352 | 1.05318 | 1.83765 |

— 26e

Temperature 40°C
Voltage 1.2v

| slew (ns) | cl (fF) | | | | | | |
|---|---|---|---|---|---|---|---|
| | 0.001 | 0.004 | 0.012 | 0.033 | 0.123 | 0.41 | 0.984 |
| 0.009647 | 0.018408 | 0.021623 | 0.029773 | 0.050607 | 0.13953 | 0.423138 | 0.990674 |
| 0.0768 | 0.035563 | 0.040572 | 0.052349 | 0.07827 | 0.171295 | 0.455428 | 1.02271 |
| 0.2874 | 0.057923 | 0.065457 | 0.083441 | 0.122647 | 0.246219 | 0.548818 | 1.11777 |
| 0.5808 | 0.077546 | 0.087263 | 0.110148 | 0.159462 | 0.314286 | 0.66242 | 1.24772 |
| 1.2258 | 0.109652 | 0.122556 | 0.152631 | 0.216735 | 0.415555 | 0.851087 | 1.5098 |

Delay table

Fig.9A best

| Temperature | Voltage | | | | | | | | |
|---|---|---|---|---|---|---|---|---|---|
| | 0.6 | 0.7 | 0.8 | 0.9 | 1.0 | 1.1 | 1.2 | 1.3 | 1.4 |
| 125 | | | | | S | ▨ | S | B | |
| 100 | | | | | ▨ | ▨ | ▨ | ▨ | |
| 75 | | | | | S | | S | S | |
| 40 | | | | | | | | | |
| 25 | | | | | | | | | |
| 5 | | | | | S | | S | S | |
| -20 | | | | | ▨ | ▨ | ▨ | ▨ | |
| -40 | | | | | S | | S | B | |

51 — 100 row band
52 — -20 row band

Fig.9B worst

| Temperature | Voltage | | | | | | | | |
|---|---|---|---|---|---|---|---|---|---|
| | 0.6 | 0.7 | 0.8 | 0.9 | 1.0 | 1.1 | 1.2 | 1.3 | 1.4 |
| 125 | | | | | B | | S | S | |
| 100 | | | | | ▨ | ▨ | ▨ | ▨ | |
| 75 | | | | | S | | S | S | |
| 40 | | | | | | | | | |
| 25 | | | | | | | | | |
| 5 | | | | | | | | | |
| -20 | | | | | | | | | |
| -40 | | | | | | | | | |

53 — 100 row band

Fig.10

| | | | | | | | |
|---|---|---|---|---|---|---|---|
| x1 | | x2 | a | x3 | $a^2$ | x4 | $a^3$ |
| x5 | b | x6 | ab | x7 | $a^2b$ | x8 | $a^3b$ |
| x9 | $b^2$ | x10 | $ab^2$ | x11 | $a^2b^2$ | x12 | $a^3b^2$ |
| x13 | $b^3$ | x14 | $ab^3$ | x15 | $a^2b^3$ | x16 | $a^3b^3$ |
| x17 | c | x18 | ac | x19 | $a^2c$ | x20 | $a^3c$ |
| x21 | bc | x22 | abc | x23 | $a^2bc$ | x24 | $a^3bc$ |
| x25 | $b^2c$ | x26 | $ab^2c$ | x27 | $a^2b^2c$ | x28 | $a^3b^2c$ |
| x29 | $b^3c$ | x30 | $ab^3c$ | x31 | $a^2b^3c$ | x32 | $a^3b^3c$ |
| x33 | d | x34 | ad | x35 | $a^2d$ | x36 | $a^3d$ |
| x37 | bd | x38 | abd | x39 | $a^2bd$ | x40 | $a^3bd$ |
| x41 | $b^2d$ | x42 | $ab^2d$ | x43 | $a^2b^2d$ | x44 | $a^3b^2d$ |
| x45 | $b^3d$ | x46 | $ab^3d$ | x47 | $a^2b^3d$ | x48 | $a^3b^3d$ |
| x49 | cd | x50 | acd | x51 | $a^2cd$ | x52 | $a^3cd$ |
| x53 | bcd | x54 | abcd | x55 | $a^2bcd$ | x56 | $a^3bcd$ |
| x57 | $b^2cd$ | x58 | $ab^2cd$ | x59 | $a^2b^2cd$ | x60 | $a^3b^2cd$ |
| x61 | $b^3cd$ | x62 | $ab^3cd$ | x63 | $a^2b^3cd$ | x64 | $a^3b^3cd$ |
| x65 | $d^2$ | x66 | $ad^2$ | x67 | $a^2d^2$ | x68 | $a^3d^2$ |
| x69 | $bd^2$ | x70 | $abd^2$ | x71 | $a^2bd^2$ | x72 | $a^3bd^2$ |
| x73 | $b^2d^2$ | x74 | $ab^2d^2$ | x75 | $a^2b^2d^2$ | x76 | $a^3b^2d^2$ |
| x77 | $b^3d^2$ | x78 | $ab^3d^2$ | x79 | $a^2b^3d^2$ | x80 | $a^3b^3d^2$ |
| x81 | $cd^2$ | x82 | $acd^2$ | x83 | $a^2cd^2$ | x84 | $a^3cd^2$ |
| x85 | $bcd^2$ | x86 | $abcd^2$ | x87 | $a^2bcd^2$ | x88 | $a^3bcd^2$ |
| x89 | $b^2cd^2$ | x90 | $ab^2cd^2$ | x91 | $a^2b^2cd^2$ | x92 | $a^3b^2cd^2$ |
| x93 | $b^3cd^2$ | x94 | $ab^3cd^2$ | x95 | $a^2b^3cd^2$ | x96 | $a^3b^3cd^2$ |

Fig.11

| | | | | | | |
|---|---|---|---|---|---|---|---|
| 0.1241215 | | 7.7106905 | a | -0.0727317 | a^2 | 0.0502302 | a^3 |
| 1.4745364 | b | -9.0833423 | ab | 22.2434171 | a^2b | -15.290963 | a^3b |
| 1.4530176 | b^2 | 16.1772271 | ab^2 | -52.919903 | a^2b^2 | 40.6060801 | a^3b^2 |
| -1.0555568 | b^3 | -4.7272741 | ab^3 | 19.2279735 | a^2b^3 | -16.573062 | a^3b^3 |
| -0.0002218 | c | -0.0173906 | ac | 0.0005317 | a^2c | -0.0010615 | a^3c |
| -0.0006379 | bc | 0.0041557 | abc | -0.0208046 | a^2bc | 0.0185084 | a^3bc |
| -0.0161241 | b^2c | 0.149116 | ab^2c | -0.3615543 | a^2b^2c | 0.2236853 | a^3b^2c |
| 0.0075133 | b^3c | -0.0867084 | ab^3c | 0.2251142 | a^2b^3c | -0.1428875 | a^3b^3c |
| 0.1779302 | d | -11.00411 | ad | 0.4205472 | a^2d | -0.299194 | a^3d |
| -1.5233151 | bd | 21.646745 | abd | -55.970691 | a^2bd | 38.8032857 | a^3bd |
| -4.3421544 | b^2d | -19.917392 | ab^2d | 77.632129 | a^2b^2d | -64.10128 | a^3b^2d |
| 2.7203239 | b^3d | 2.5195814 | ab^3d | -21.032266 | a^2b^3d | 22.1105662 | a^3b^3d |
| 0.0004939 | cd | 0.0313236 | acd | 0.0012848 | a^2cd | 0.0005202 | a^3cd |
| -0.0025665 | bcd | 0.01909 | abcd | -0.0389342 | a^2bcd | 0.0168797 | a^3bcd |
| 0.0326865 | b^2cd | -0.3412997 | ab^2cd | 0.8761655 | a^2b^2cd | -0.5546441 | a^3b^2cd |
| -0.0149227 | b^3cd | 0.1869738 | ab^3cd | -0.5062697 | a^2b^3cd | 0.3262527 | a^3b^3cd |
| 0.0745183 | d^2 | 4.4519519 | ad^2 | -0.2091287 | a^2d^2 | 0.1558038 | a^3d^2 |
| 0.3998609 | bd^2 | -9.3350094 | abd^2 | 24.6620979 | a^2bd^2 | -17.392142 | a^3bd^2 |
| 2.4345425 | b^2d^2 | 3.6755173 | ab^2d^2 | -21.054482 | a^2b^2d^2 | 20.2055176 | a^3b^2d^2 |
| -1.4558076 | b^3d^2 | 1.7268837 | ab^3d^2 | 1.4875193 | a^2b^3d^2 | -4.879199 | a^3b^3d^2 |
| -0.0002529 | cd^2 | -0.0134414 | acd^2 | -0.0016598 | a^2cd^2 | 0.000453 | a^3cd^2 |
| 0.0024841 | bcd^2 | -0.0206278 | abcd^2 | 0.0528498 | a^2bcd^2 | -0.030939 | a^3bcd^2 |
| -0.0160083 | b^2cd^2 | 0.1801713 | ab^2cd^2 | -0.4797889 | a^2b^2cd^2 | 0.3074671 | a^3b^2cd^2 |
| 0.0072285 | b^3cd^2 | -0.0947185 | ab^3cd^2 | 0.2640104 | a^2b^3cd^2 | -0.1715408 | a^3b^3cd^2 |

Fig.12

METHOD AND PROGRAM FOR LIBRARY GENERATION

CROSS-REFERENCE TO RELATED APPLICATIONS

This application is based upon and claims the benefit of priority from prior Japanese Patent Application No. 2004-155086, filed on May 25, 2004, the entire contents of which are incorporated herein by reference.

BACKGROUND OF THE INVENTION

The present invention relates to a method and program for generating a library.

In recent years, there is a demand for shortening the time for designing a high-integration and high-speed semiconductor integrated circuit device. During the design stage of a semiconductor integrated circuit device, a library, which is generated under certain operating conditions, is used to conduct various verifications on the semiconductor integrated circuit. However, the extraction conditions for configuring the library may differ from a client's actual operating conditions. This may decrease verification accuracy. Thus, there is a demand for the generation of a library that enables verifications to be performed with high accuracy in accordance with actual operating conditions.

When designing a semiconductor integrated circuit device (LSI), such as an application specified integrated circuit (ASIC), the designed LSI must be verified whether the specification required by the client is satisfied. The verification includes determining whether the LSI functions properly under the client's usage conditions (operating conditions of the LSI). Cells forming the LSI are registered in the library. In the design stage, the library includes data indicating the relationship between the operating conditions (temperature and voltage) and the operating characteristics of each cell. The data for the operating characteristics is used in the verification of the LSI.

However, the client's operating conditions may not match the extraction conditions for the library. Therefore, in the prior art, a characteristic library including characteristic values under the operating conditions corresponding to the client's specification is generated (refer to Japanese Laid-Open Patent Publication Nos. 2001-168200 and 2002-222232). The employment of the characteristic library enables the verification of an LSI under the client's desired operating conditions.

Figure 1:
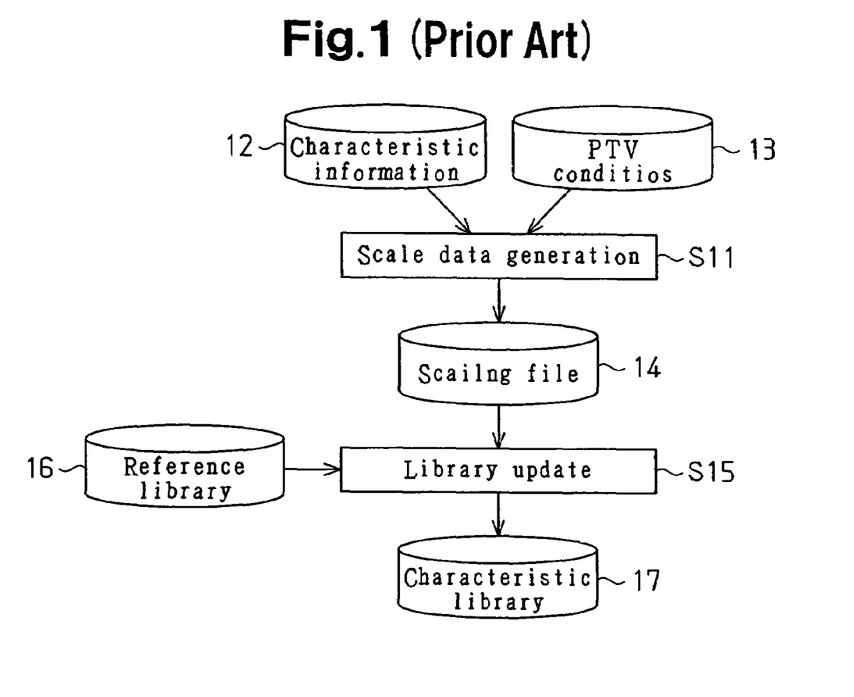
FIG. 1 is a flowchart showing a method for generating a characteristic library in the prior art.

The processing performed to generate a characteristic library in the prior art will now be described with reference to the flowchart of FIG. 1.

First, in the scale data generation process S11, characteristic information 12 and operating conditions (P, T, and V conditions) 13, which correspond to a client's specification, are included in a library. In accordance with the characteristic information and the operating conditions, correction coefficients (temperature coefficient and voltage coefficient) are calculated or extracted to generate a scaling file, which includes the correction coefficients. Then, in a library updating process S15, a reference library 16, which stores characteristic information under standard operating conditions (e.g., in a typical manufacturing process, the voltage is referred to as a standard voltage and the temperature is referred to as a standard temperature) is referred to in order to multiply a characteristic value by the correction coefficient to calculate a correction characteristic value and generate a characteristic library 18, which includes the correction characteristic value.

SUMMARY OF THE INVENTION

However, in the prior art method, every one of the characteristic values stored in the reference library 16 is multiplied by the correction coefficient. Under conditions differing from the conditions in which the correction coefficient was calculated, the correction characteristic value may deviate greatly from the actual characteristic value. Thus, the verification accuracy is low. When performing verification with a characteristic value obtained by multiplying the correction coefficient by a characteristic value stored in the reference library, the deviation (difference) between the calculated characteristic value and the actual characteristic value must be taken into consideration. More specifically, margins are required for the timings for performing verifications, such as when performing delay calculation or noise analysis. It is thus difficult to converge the verification timings, and much time and work would be necessary to perform the verifications.

Figure 2:
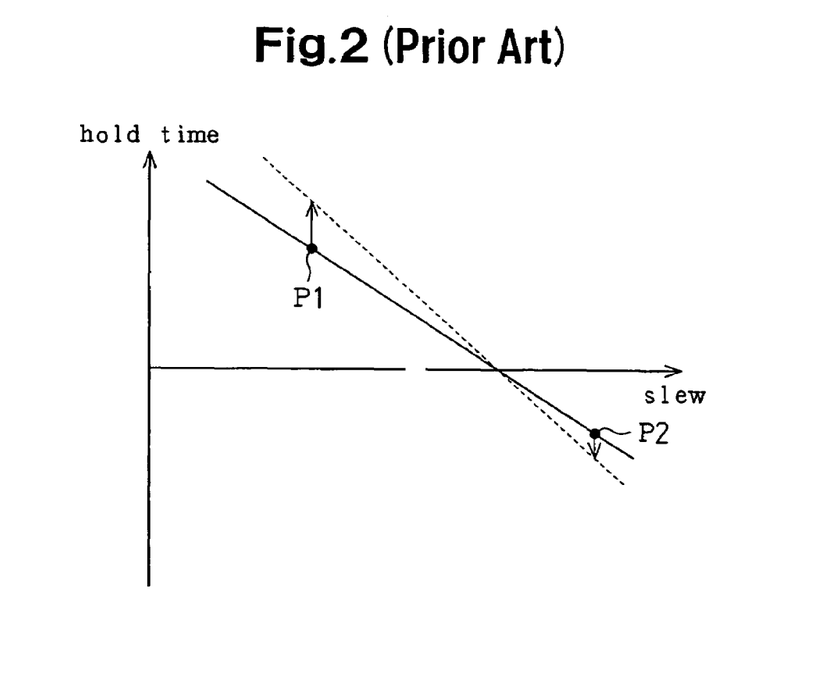
FIG. 2 is a graph used when multiplying a correction coefficient to calculate a correction hold time.

Further, parameters such as an input capacitance cannot be used as scaling factors. Additionally, when the characteristic value includes positive values and negative values, such as in the relationship between a slew rate and a hold time, when multiplying the characteristic value by the correction coefficient to scale the characteristic value, a correction reversed from the intended correction may be made. FIG. 2 shows an example in which the standard characteristic values (characteristic value stored in the reference library) of the hold time relative to the slew rate is shown by the solid line, and the characteristic values obtained when multiplying the standard characteristic value by a positive correction coefficient is shown by the broken line. The characteristic values are to be corrected so that the values at all of the characteristic points are increased by, for example, temperature conditions. In the prior art, a characteristic point P1 having a positive value is multiplied by a correction coefficient and corrected to a value that is in accordance with the usage conditions. However, when a characteristic point P2 having a negative value is multiplied by a correction coefficient, the characteristic point P2 would be corrected to a small value and become further deviated from a value that is in accordance with the usage conditions.

Design tools (timing analysis tools) for performing verification are provided by various vendors. However, the format of the scaling file 14 differs between vendors. Thus, when using more than one timing analysis tool, the scaling file 14 must be generated in compliance with each vendor's format.

One aspect of the present invention is a method for generating a library that stores cell information including characteristic data representing the characteristic of a cell under a designated condition. The method includes generating a characteristic extraction library including the characteristic data under a predetermined condition in an applicable range including the designated condition, determining a characteristic approximation function corresponding to a selected characteristic by referring to the characteristic extraction library, calculating the characteristic data under the designated condition in accordance with the characteristic approximation function, and generating a library including the calculated characteristic data.

Another aspect of the present invention is a program product for use with a computer having a storage device. The program product includes media storing program code executable by the computer for generating a library that stores cell information including characteristic data representing the characteristic of a cell under a designated condition. A characteristic extraction library including the characteristic data under a predetermined condition in an applicable range including the designated condition is stored in the computer having a storage device. The program code when executed by the computer causes the computer to perform steps including determining a characteristic approximation function corresponding to a selected characteristic from the characteristic extraction library, calculating the characteristic data under the designated condition using the characteristic approximation function, and generating a library including the calculated characteristic data.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A method for generating a library according to a first embodiment of the present invention will now be discussed.

Figure 3:
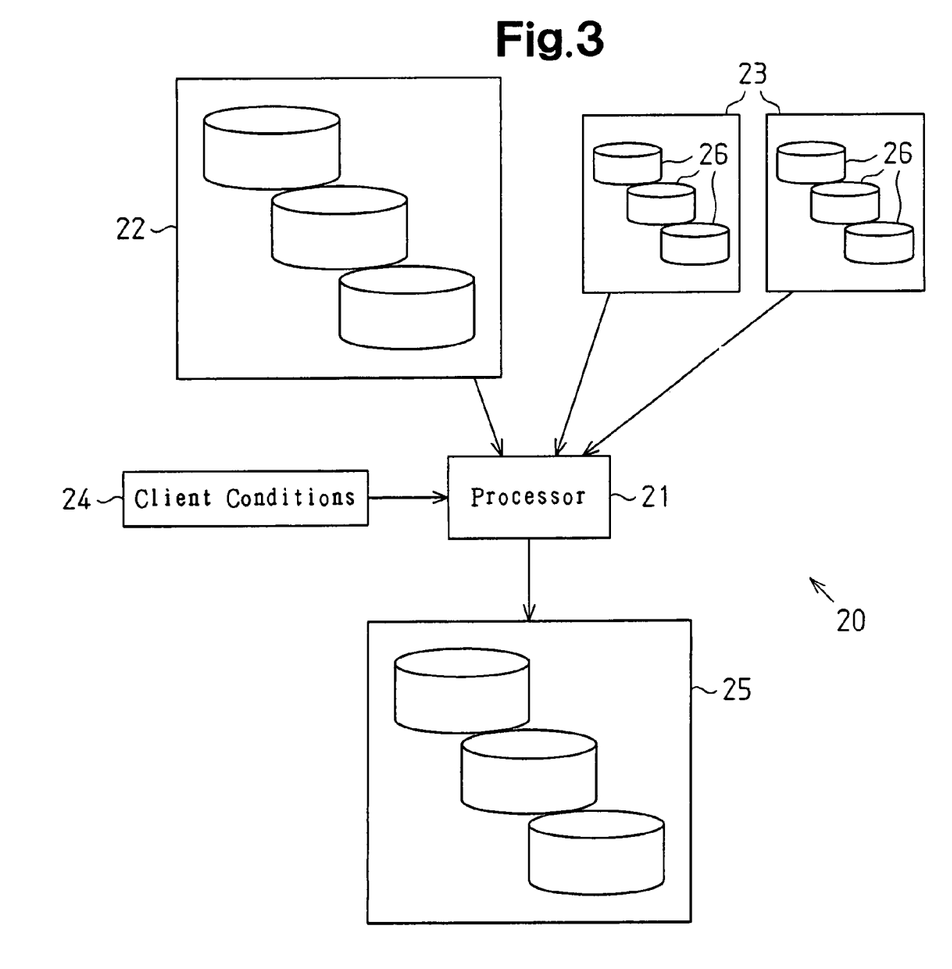
FIG. 3 is a schematic view showing a library generation device according to a first embodiment of the present invention.

FIG. 3 is a schematic view showing a library generation device 20, which is used to verify a design for a semiconductor integrated circuit device. The library generation device 20 includes a processor 21 for generating library data. The processor 21 executes a library generation program and generates a library 25 for verification (verification library), which is readable by a timing analysis tool, based on a reference library 22, a characteristic extraction library 23, and client conditions 24, which are the conditions designated by a client.

The reference library 22 is in a format that is readable by various timing analysis tools (e.g., timing verification tool). The reference library 22 includes information for various cells that is used to design a semiconductor integrated circuit device. The cell information includes characteristic data representing the characteristics of cells under standard conditions.

The characteristic extraction library 23 includes a plurality of characteristic extraction tables 26. The characteristic extraction tables 26 store characteristic values obtained under a plurality of different predetermined conditions. The client conditions 24 are sign off conditions (conditions for guaranteeing the quality of a product) and include the temperature condition and voltage condition under which the client uses a semiconductor integrated circuit device.

The processor 21 extracts (determines) an nth power polynomial function based on the characteristic extraction tables 26 when generating the verification library 25. The extraction of a polynomial function refers to the determination of a coefficient for each term in a polynomial function corresponding to the characteristic that is subject to verification.

The power number and the term number in the polynomial function are determined in accordance with factors, such as the characteristic that is subject to verification, the tolerable error of the characteristic data, and the processing time.

For example, a polynomial function for obtaining the delay characteristic value, delay, is represented by the next expression.

$$delay = f(cl, sl, t, v)$$

The delay characteristic value delay is a function of the capacitance cl, the slew rate sl, the temperature t, and the power supply voltage v. A specific example of the function is shown below.

$$delay = FA \times FB \times FC \times FD \qquad \text{expression 1}$$

$FA = (A1 + A2 \times cl + A3 \times cl\textasciicircum A2 + A4 \times cl\textasciicircum A3)$
$FB = (B1 + B2 \times sl + B3 \times sl\textasciicircum A2 + B4 \times sl\textasciicircum A3)$
$FC = (C1 + C2 \times t)$
$FD = (D1 + D2 \times v + D3 \times v\textasciicircum A2)$ In the above polynomial function, FA is a term related with the capacitance cl and is a third power function of the capacitance cl. FB is a term related with the slew rate sl and is a third power function of the slew rate sl. FC is a term related with the temperature t and is a first power function (linear expression) of the temperature. FD is a term related with the voltage v and is a second power function (quadratic function) of the voltage v. In the above polynomial, "^" represents power. For example, "v^2" represents v raised to the second power.

Figure 10:
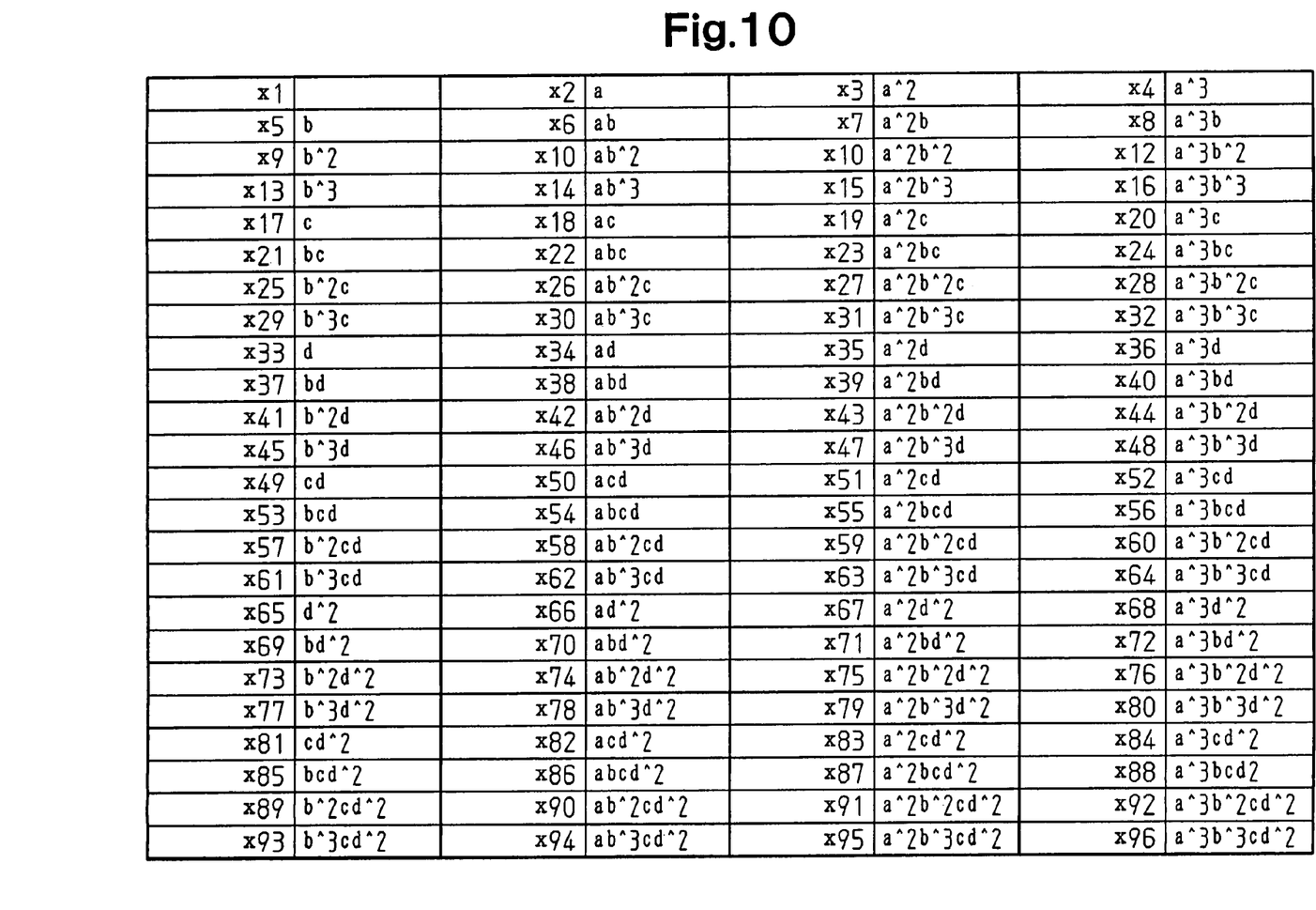
FIG. 10 is a table showing an example of input data for polynomial approximation.
Figure 11:
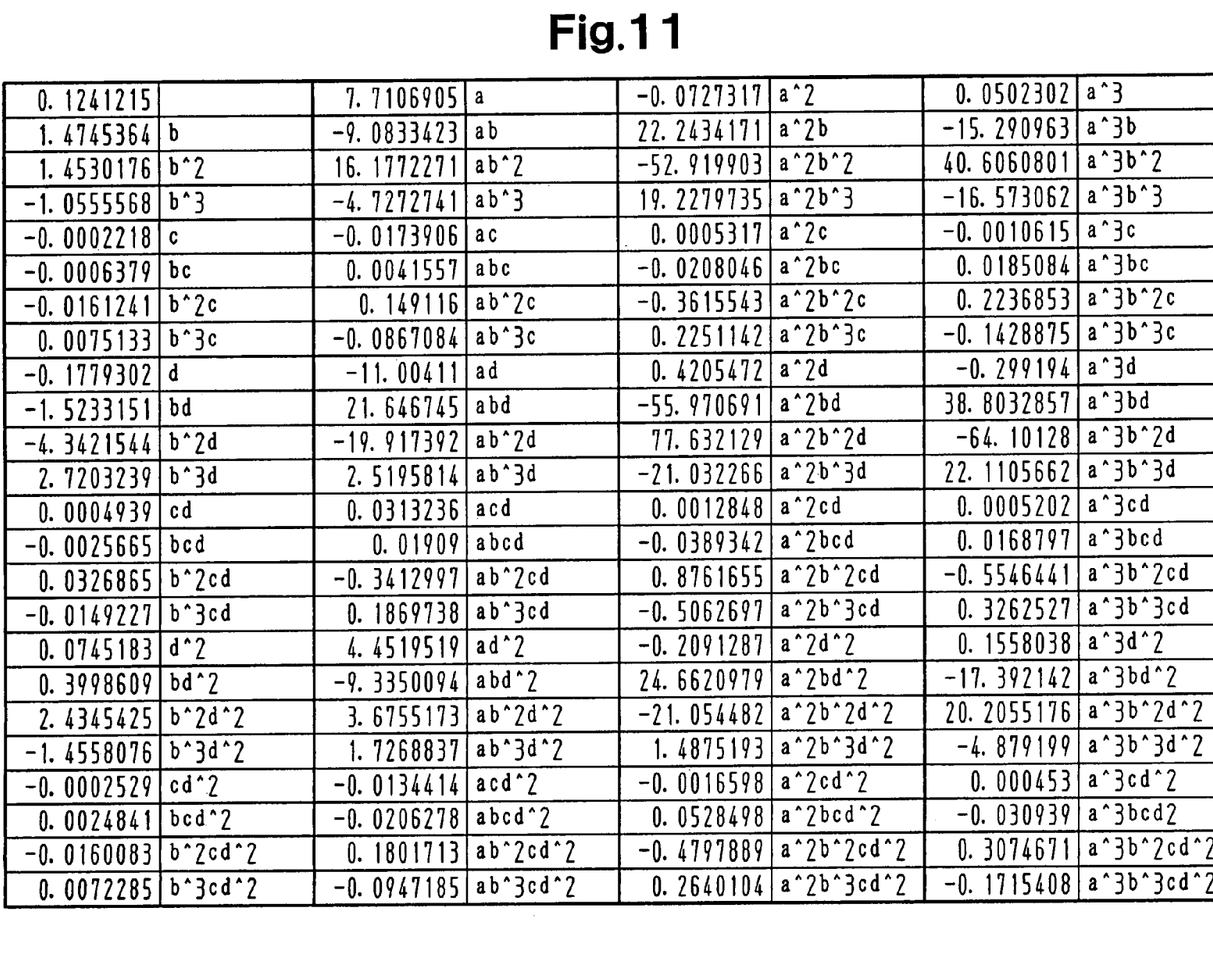
FIG. 11 is a table showing the procedures for polynomial approximation.

The processor 21 uses a matrix formularized from the data of the characteristic extraction library 23 to obtain the values of coefficients A1 to A4, B1 to B4, C1, C2, and D1 to D3 in each term of the above polynomial function. Based on the above polynomial function and the calculated values for the coefficients A1 to D3, the processor 21 calculates the characteristic value delay that corresponds to the client conditions 24. FIG. 10 shows the data input for matrix calculation, and FIG. 11 shows the procedures for polynomial approximation.

Figure 8:
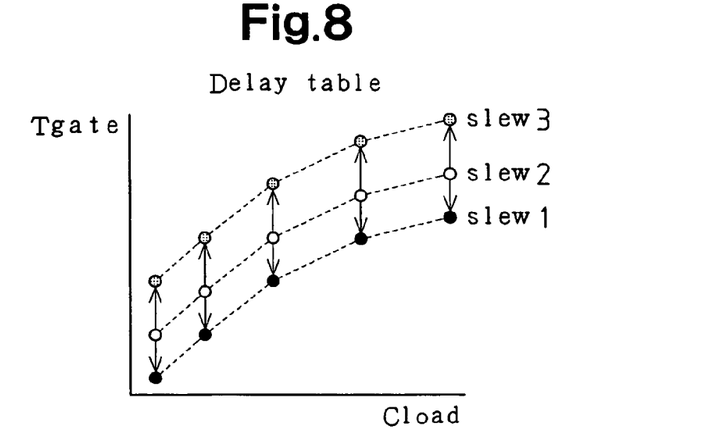
FIG. 8 is a graph showing an example of an approximation.

FIG. 8 is a graph showing the relationship between the capacitive load ($C_{load}$) and the gate delay time ($T_{gate}$). Three characteristic curves slew1, slew2, and slew3 corresponding to three different temperature and voltage conditions are shown in the graph. The characteristic curve slew2 is plotted along the characteristic values of a delay table included in the reference library corresponding to a standard temperature and voltage condition. The characteristic curves slew1 and slew3 are plotted along the characteristic values, which are calculated with a characteristic approximation function, for a delay table included in the library for verification corresponding to conditions differing from the standard temperature and voltage condition. The difference between each characteristic value from the characteristic value obtained through a simulation is converged in a predetermined range. In the prior art method that multiplies a correction coefficient, for example, with regard to the characteristic point at the right end in FIG. 8, even if the characteristic point subsequent to a condition change is generally the same as a simulation result, in the characteristic point at the left end, the value corrected by the correction coefficient deviates from the value of the simulation result and is close to the value of the characteristic point for the standard characteristic. That is, the error is greater than that of the first embodiment. In the first embodiment, by using characteristic interpolation data and the characteristic approximation function, the characteristic point is obtained more accurately than in the prior art.

The above polynomial function is an example of a function for obtaining the delay characteristic value delay. A polynomial function for obtaining a transition period or timing may be used. However, the element or power number in each term differs from that of a function for obtaining the delay characteristic value delay. For example, a timing characteristic value timing is defined as a function of the slew rate value dsl of data, the flow rate value csl of a clock signal, the temperature t, and the voltage v. The power for each element is determined as the second power for the data slew rate value, the second power for the clock signal slew rate value, the first power for the temperature, and the second power for the voltage.

In this manner, a polynomial function determined in accordance with the required characteristic is used to obtain a characteristic value in accordance with the client conditions. Accordingly, a library for a characteristic that is in accordance with the operating conditions for each client is easily generated. This enables the demands of each client to be easily coped with.

Further, a value of the characteristic data obtained in accordance with the above polynomial function is smaller than the value obtained through a simulation, and the error between the two values is less than a predetermined value (e.g., five percent). This error is less than an error between a value obtained using a scaling factor in the prior art and a value obtained through a simulation. Further, in the first embodiment, the characteristic data is obtained from the characteristic extraction data. Thus, the problem of the prior art (negative characteristic value) when using a scaling factor is avoided. In addition, in the first embodiment, the power number of the polynomial function is determined as required so that the time required for determining the polynomial function is within a practical range.

The processor 21 generates the verification library 25, which includes the obtained characteristic values. The processor 21 refers to the reference library 22 to generate the verification library 25 in a format matching the format of the reference library 22. Furthermore, the processor 21 refers to the reference library 22 to copy the format information included in the reference library 22. The format and format information of the verification library 25 are substantially the same as those of the reference library 22. Thus, in the same manner as the reference library, the verification library 25 is written to a timing analysis tool without any problems.

Figure 4:
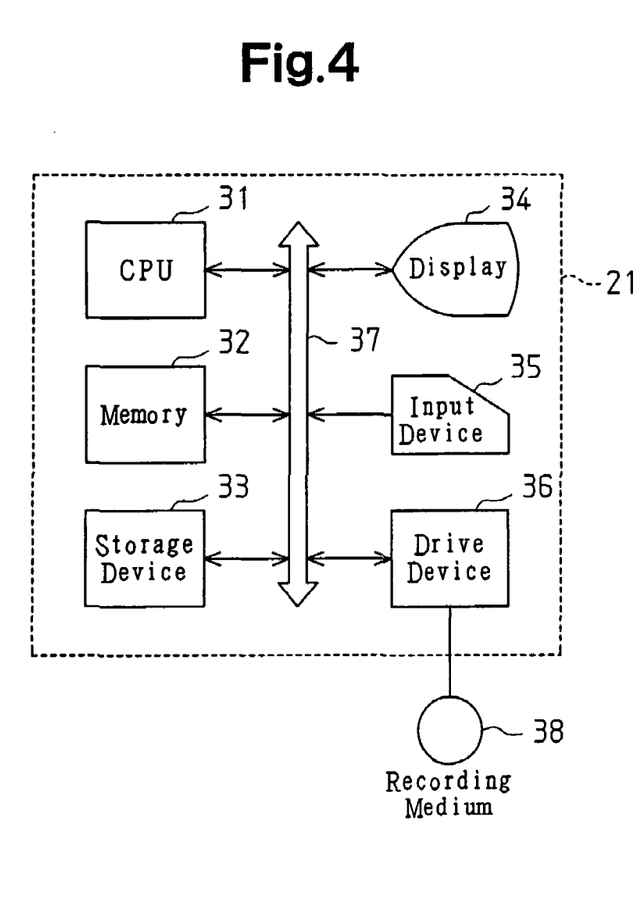
FIG. 4 is a schematic diagram showing a processor.

FIG. 4 is a schematic diagram of the processor.

The processor 21, which is a typical computer aided design (CAD) device, includes a central processing unit (CPU) 31, a memory 32, a storage device 33, a display 34, an input device 35, and a drive device 36, which are connected to one another by a bus 37.

The CPU 31 executes programs using the memory 32 and performs various processes such as layout design for a semiconductor device, delay calculation, characteristic extraction, and library generation. The memory 32 stores program and data required for performing the processes. The memory 32 includes a cache memory, a system memory, and a display memory. The display 34 is used to display a circuit layout and a parameter input page. The display 34 may be a CRT, an LCD, or a PDP. The input device 35 is used to input parameters and the requests and commands of a user. The input device 35 includes a keyboard and a mouse.

Figure 5:
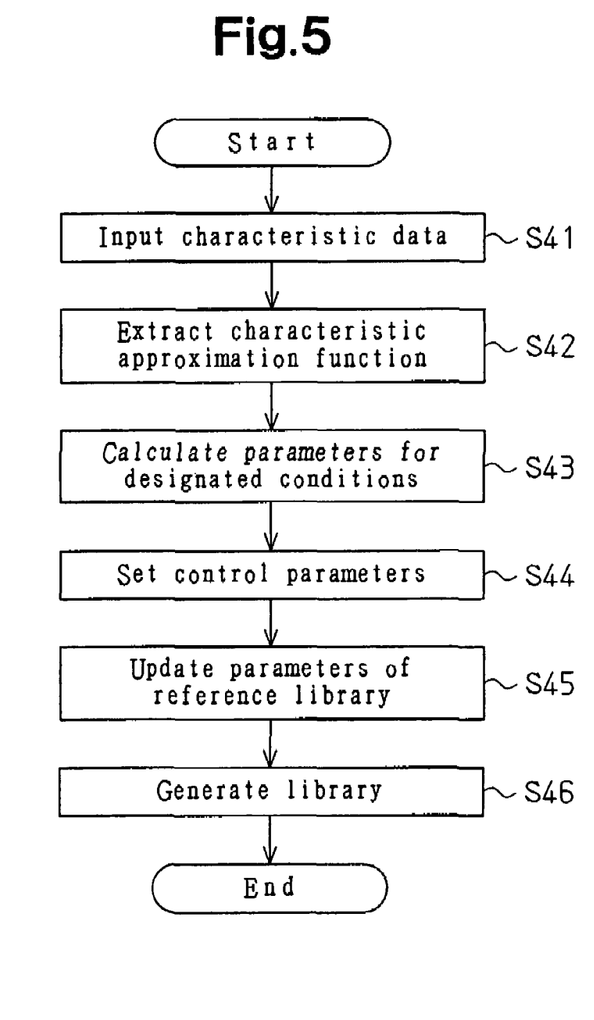
FIG. 5 is a flowchart showing the procedures for generating a library.

The storage device 33 may be a magnetic disk, an optical disc, or a magneto-optical disc. The storage device 33 stores various files and programs for generating a library that is shown in FIG. 5. In response to a command from the input device 35, the CPU 31 transfers programs and data from the storage device 33 to the memory 32 and executes the programs.

The processor 21 provides, for example, via a recording medium 38, the CPU 31 with library data and programs that are executed by the CPU 31. The CPU 31 drives the drive device 36 to access the contents stored by the recording medium 38, read programs from the recording medium 38, and install the programs in the storage device 33.

The recording medium 38 may be any type of a computer readable recording medium, such as a magnetic tape (MT), a memory card, a flexible disk, an optical disc (CD-ROM, DVD-ROM, etc.), or a magneto-optical disc (MO, MD, etc.). The above programs and data are stored in the recording medium 38 and loaded to the memory 32 when necessary.

The recording medium 38 may also be a medium or a disk device that records programs downloaded and uploaded via a communication medium. Further, in addition to being a recording medium that records programs directly executed by a computer, the recording medium may be a recording medium that records programs executed by first installing the programs on another recording disk (hard disk, etc.) or a recording medium that records encoded or compressed programs.

The generation of a library will now be discussed.

FIG. 5 is a flowchart partially showing a library generation program executed by the processor 21 of FIG. 3. The processor 21 executes steps S41 to S46 to generate the verification library 25 shown in FIG. 3.

First, in step S41, the processor 21 performs a characteristic data input process, which includes the input of the characteristic extraction library 23 of FIG. 3. In step S42, the processor 21 extracts a characteristic approximation function from the characteristic extraction library 23. That is, the processor 21 determines a coefficient of a polynomial function set for characteristic values with the characteristic extraction library 23.

Then, in step S43, the processor 21 calculates parameters related with conditions designated by a client. That is, the processor 21 uses the coefficient calculated in step S42 to calculate characteristic values for conditions designated by a client in accordance with the related polynomial function.

In step S44, the processor 21 sets control parameters based on the characteristic extraction library 23. The control parameters include maximum transition time (max transition), maximum capacitance (max capacitance), and tentative wire capacitance (wire load model (WLM)). The tentative wire capacity is used for logic synthesizing and tentative wire delay calculation. The tentative wire capacitance is a value corresponding to a delay time in which resistance is taken into consideration. With regard to changes in the PTV conditions, the processor 21 performs, for example, linear interpolation to correct a resistance value affected by the temperature and voltage or to correct a cell characteristic that fluctuates due to the temperature and voltage.

The processor 21 sets these control parameters based on the data included in the characteristic extraction library 23. During the processing, when interpolation data exists, the processor 21 uses the interpolation data to calculate parameters under conditions designated by the client and set the calculated values as the values of control parameters. When a fixed value is included in the characteristic extraction library 23 or the client conditions 24 during the calculation of the control parameters, the processor 21 sets the control parameters based on the fixed value.

In step S45, the processor 21 loads data from the reference library 22 to the memory 32. The processor 21 then rewrites the characteristic values calculated in step S43 and the control parameters set in step S44 to the loaded data to update parameters. This generates tentative data, which is substantially the updated reference library 22, in the memory 32.

Then, in step S46, the processor 21 generates the verification library 25, which includes the tentative data generated in the memory 32 in step S45.

The various types of data required for the above processing will now be discussed.

Figure 6:
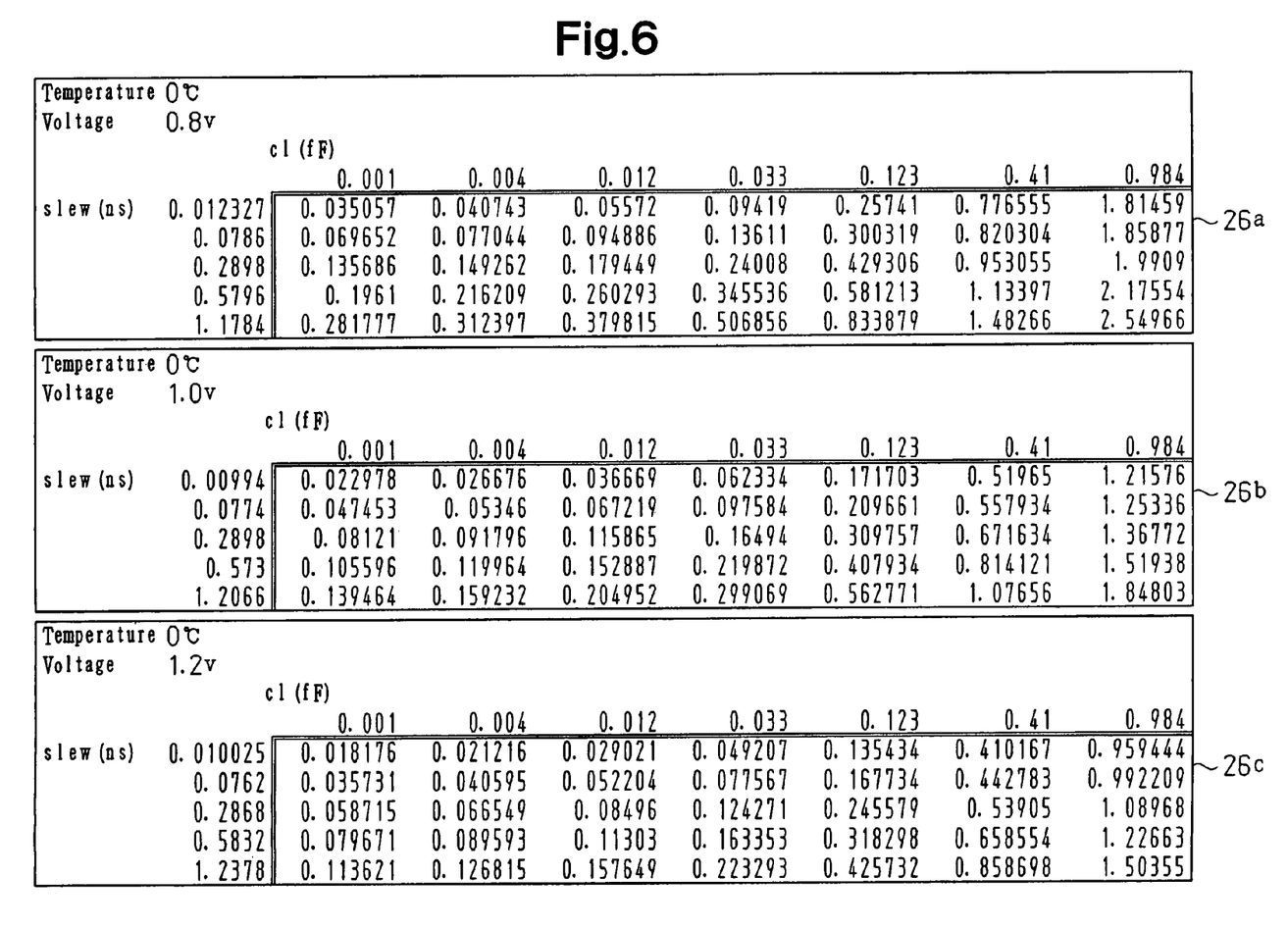
FIG. 6 is a characteristic extraction table.
Figure 7:
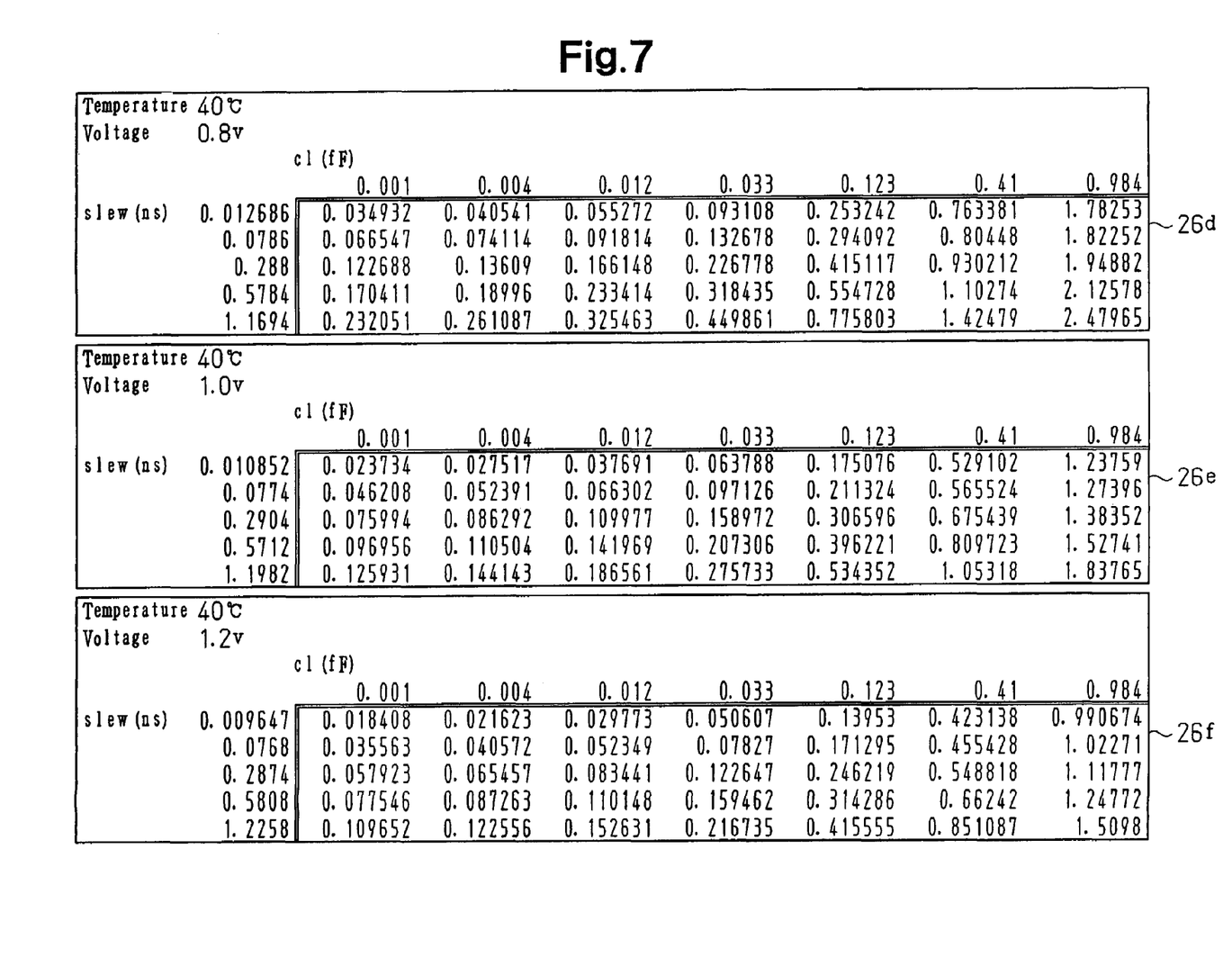
FIG. 7 is another characteristic extraction table.

First, the characteristic extraction library 23 will now be discussed. The characteristic extraction library 23 includes a plurality of characteristic extraction tables 26 corresponding to the characteristics of the verified characteristic values. In the first embodiment, the characteristic extraction library 23 includes characteristic extraction tables 26 for the characteristic values of at least six conditions (two temperatures×three voltages). For example, when the temperature conditions are T1 (0°) and T2 (40°) and the voltage conditions are V1 (0.8V), V2 (1.0V), and V3 (1.2V), the characteristic extraction library 23 includes a plurality of characteristic extraction tables 26 showing voltage dependency under temperature T1. That is, as shown in FIG. 6, the characteristic extraction library 23 includes a characteristic extraction table 26a for temperature T1 and voltage V1, a characteristic extraction table 26b for temperature T1 and voltage V2, and a characteristic extraction table 26c for temperature T1 and voltage V3. Further, the characteristic extraction library 23 includes a plurality of characteristic extraction tables 26 showing voltage dependency under temperature T2. That is, as shown in FIG. 7, the characteristic extraction library 23 includes a characteristic extraction table 26d for temperature T2 and voltage V1, a characteristic extraction table 26e for temperature T2 and voltage V2, and a characteristic extraction table 26f for temperature T2 and voltage V3.

Figure 9A:
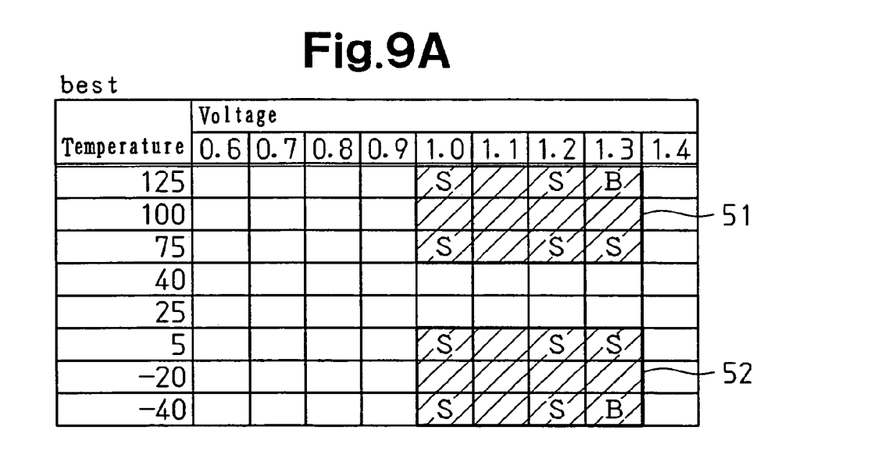
FIGS. 9A and 9B are maps showing approximation ranges.

The conditions for generating the characteristic extraction tables 26a to 26f are determined so that the accuracy of the characteristic data calculated from the above polynomial function and the processing time for calculating the characteristic data are acceptable. For example, the size (applicable range) of the characteristic extraction table is determined so that the accuracy of the characteristic data and the processing time are well-balanced. For example, the temperature width is 50° C. and the voltage width is 0.5 V. As shown in FIG. 9A, there may be a plurality of applicable ranges. In each applicable range, results (coefficient of polynomial function, characteristic table, and library for verification) are obtained within a practical processing time. Further, the accuracy of the characteristic data in the library for verification (the error of the values obtained through a simulation) is within a predetermined range (e.g., ±five percent).

The above conditions are set based on the operation range of the semiconductor integrated circuit device. The operation range of the semiconductor integrated circuit device is registered as a standard PTV condition in the reference library 22 and is, for example, power supply voltage 0.6V to 1.4V, temperature −40° C. to 125° C., and voltage drop (IR drop) within 10 percent. The operation range is the range in which the semiconductor integrated circuit device is operable (the range in which operation is guaranteed) and includes the conditions actually used by the client. It is required that a characteristic table be generated under the conditions in which the client uses the semiconductor integrated circuit device. Thus, if the client's usage range is wide, a plurality of characteristic tables may be generated in accordance with the range. Further, a polynomial function may be generated for each characteristic table.

More specifically, one condition for generating the characteristic extraction tables 26 (26a to 26f) is determined from the characteristic data calculated by the above polynomial function and the processing time for calculating the characteristic data. Among the relatively wide operation ranges for a semiconductor integrated circuit device shown in FIGS. 9A and 9B, at least one is selected for the range of the operating condition corresponding to the client's usage condition to generate a characteristic table in correspondence with each range.

For example, referring to FIG. 9A, a first range 51 has a temperature width of 50° C. and a voltage width of 0.3 V. Accordingly, if the first range is within the applicable range and the voltage and temperature is within the first range 51, the calculation of the characteristic data (approximation value) is enabled by one characteristic approximation function and one set of the characteristic extraction library (six characteristic extraction tables 26). In the same manner, if the voltage and temperature is within a second range 52, the calculation of the characteristic data is enabled. The temperature and voltage conditions differ between the first range 51 and the second range 52. Thus, the characteristic interpolation data of the characteristic extraction library 23 differs between the first range 51 and the second range 52.

Figure 9B:
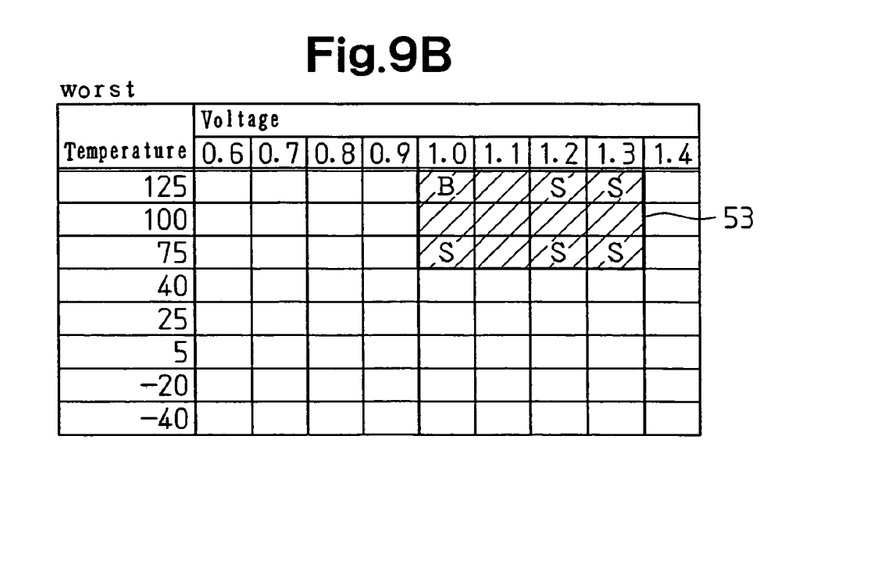

Referring to FIG. 9B, a third range 53 is a range that is substantially the same as the first range. Thus, if the voltage and temperature is within the third range 53, the calculation of the characteristic data is also enabled. Although the temperature and voltage conditions of the third range 53 is substantially the same as the first range 51, the third range 53 includes the worst characteristics, and the first range 52 includes the best characteristics. Accordingly, the characteristic values differ between the first and third ranges 51 and 53. Thus, the corresponding characteristic interpolation data of the characteristic extraction library 23 differs between the first and second ranges 51 and 53.

When generating the characteristic extraction table 26 to obtain the characteristic values corresponding to the client's conditions in the first to third ranges 51 to 53, for each of the first to third ranges 51 to 53, maximum and minimum values (boundary values) of the temperature and the voltage and an arbitrary value between the maximum and minimum values (intermediate value) must be obtained. For example, in the first range 51, "1.0 V" is selected as the minimum voltage value, "1.3 V" is selected as the maximum voltage value, "1.2 V" is selected as the intermediate voltage value, "75° C." is selected as the minimum temperature value, and "125° C." is selected as the maximum temperature value. That is, 75° C., 125° C., 1.1 V, 1.2 V, and 1.3V of FIG. 9A are respectively selected as the temperatures T1 and T2 and the voltages V1 to V3 to generate the characteristic extraction tables 26. Based on a characteristic approximation function extracted from the characteristic extraction tables 26, the characteristic values in this range are accurately obtained within a short period of time to generate the verification library 25, which includes these characteristic values.

In FIGS. 9A and 9B, the first range 51 is an example of the conditions for generating the library for verification under the worst power conditions, and the second range 52 is an example of the conditions for generating the verification library 25 under the best conditions, the third range 53 is an example of the conditions for generating the verification library 25 under the worst conditions.

For conditions related with the manufacturing process (process conditions), approximation cannot be performed with polynomial functions. Thus, when conducting a verification taking into consideration the process conditions, the characteristic extraction tables 26a to 26f must be prepared in accordance with the process conditions. In the same manner, when conducting a verification taking into consideration power consumption, the characteristic extraction tables must be prepared in accordance with the power consumption. Thus, in the characteristic extraction library 23, the characteristic extraction tables 26 include a group of six characteristic extraction tables 26a to 26f and plural groups corresponding to process conditions (six worst process conditions, six best process conditions, six worst power conditions, and six typical conditions (standard values)). The range between the best process conditions and the worst process conditions indicate the range of manufacturing differences of a transistor resulting from the process and the range of capacitances between wires.

In FIGS. 9A and 9B, among the six characteristic extraction tables 26, the letter B marked in the first to third ranges represents the PTV condition of one table (basic table), and the letter S represents the PTV condition of the other characteristic extraction tables (characteristic interpolation table). In other words, the characteristic extraction library 23 includes one basic table and five characteristic interpolation tables.

The number of data pieces in the basic table and the characteristic interpolation table is set in accordance with the number of data pieces in the characteristic tables of the reference library 22. The number of data pieces of at least the basic table is equal to the number of data pieces of the characteristic tables in the reference library 22. The number of data pieces of other tables is less than or equal to the data pieces of the characteristic tables of the reference library 22. For example, for a characteristic table having characteristic data for 7×7 points (49), the basic table has data for 7×7 points, and the five characteristic interpolation tables have data for 4×4 points (16), which is less than the data of the basic table.

The number of pieces of data and conditions for the five characteristic interpolation tables are set so that the same amount of data as the basic table is generated through interpolation. For example, when generating data for the above seven points through interpolation (insertion), data for four points or more is necessary. When the values of one element of the basic table are X1, X2, X3, X4, X5, X6, and X7, the values of the elements of the characteristic interpolation table are set at X1, X3, X5, and X7. When the number of data pieces for an element of the characteristic interpolation table is six points (X1, X2, X3, X4, X5, and X6), the number of data pieces of an element of the characteristic interpolation table is four points or more. In this case, the preferred values are X1, X3, X4, and X6. The total amount of data of these tables is approximately 40 percent of the total data amount for when every table has 7×7 points of data.

The approximation accuracy is improved when one of the characteristic extraction tables 26 (in the first embodiment, the basic table) has data for every point in the corresponding applicable range. That is, when approximating data between four pieces of characteristic data that are plotted (curve formed by connecting the characteristic data), if the curve connecting the four pieces of characteristic data is separated from the plotting (curve) of the original characteristic data, a large approximation error occurs. Thus, the basic table including all of the points in the corresponding applicable range is used to correct the plotting of data. This decreases the approximation error.

The processor 21 uses the data of the characteristic extraction table 26 (characteristic interpolation table) to generate interpolation data between each piece of data by performing, for example, interpolation. This generates 49 pieces of characteristic data. The processor 21 determines a characteristic approximation function based on the 49 pieces of characteristic data. In this manner, by decreasing the amount of data of the characteristic extraction table 26 (characteristic interpolation table), the amount of data in the storage device 33 is decreased, and the library generation device 20 may be used even if the storage device 33 has a small capacity. Further, since interpolation data is generated through interpolation, the error of the generated characteristic data is small. This accurately generates characteristic data. By determining the coefficient of a characteristic approximation function based on the characteristic data generated in this manner, a coefficient having high approximation accuracy is generated. This improves the accuracy of the values included in the verification library 25.

The number of data pieces in the characteristic interpolation table may be changed. When the number of data pieces in the basic table is 7×7 points, it is only required that the number of data pieces in the characteristic interpolation table be 4×4 points. Further, the number of rows and the number of columns in the basic table and the characteristic table may differ like 7×5 or 5×7. Additionally, the number of data pieces may be changed in accordance with the characteristics.

The verification library 25 will now be described.

Figure 12:
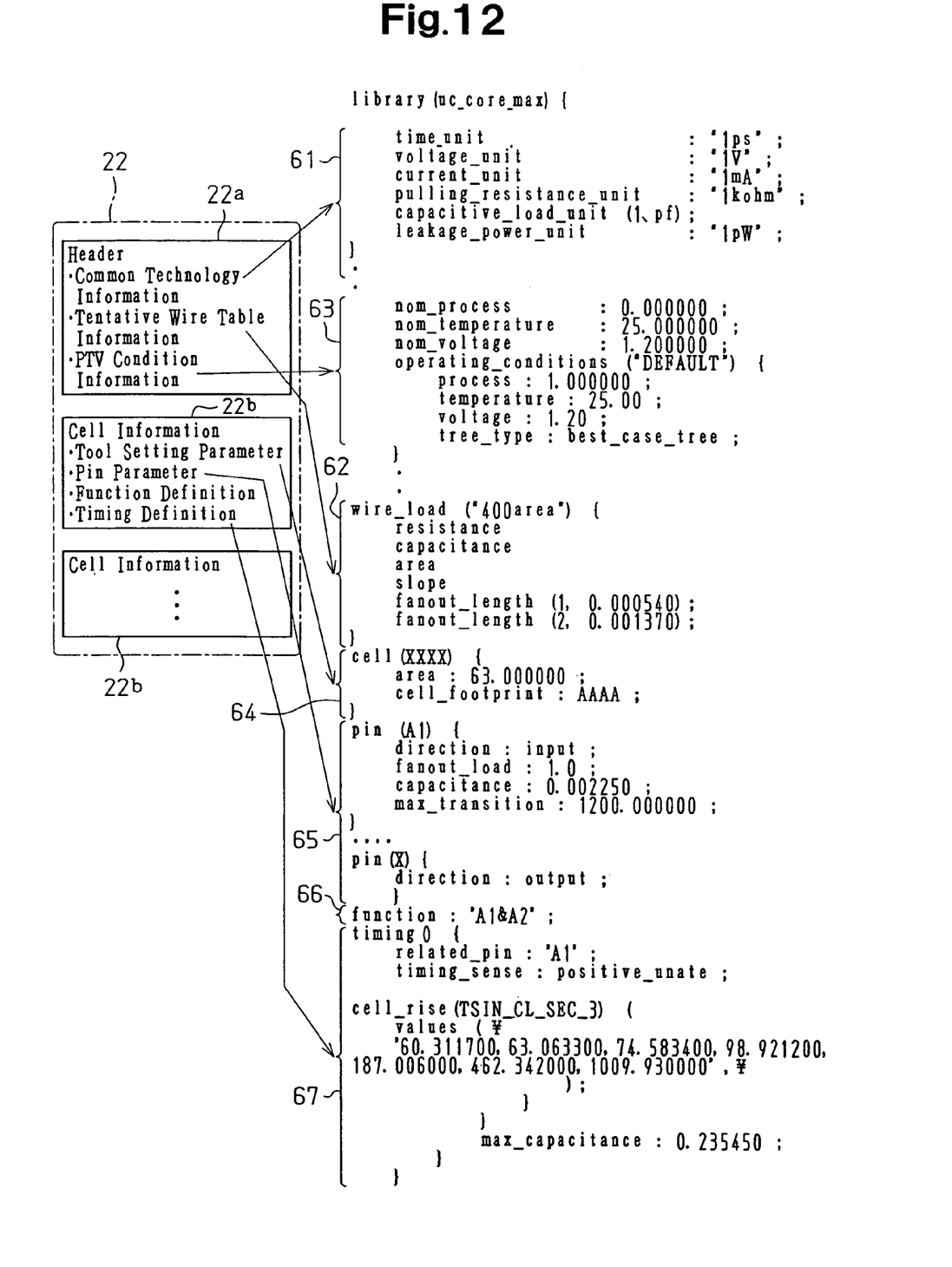
FIG. 12 is a chart showing an example of library data.

FIG. 12 is a chart showing the configuration of a timing library. The left side of FIG. 12 summarizes the configuration, and the right side shows a description example. The verification library 25 has substantially the same configuration as the reference library 22. Thus, the configuration of the verification library 25 will not be described.

The reference library 22 includes a header 22a and plural pieces of cell information 22b. The header 22a includes common technology information 61, tentative wire table information 62, and PTV condition information 63. The common technology information 61 includes the unit of the values included in the reference library 22. The tentative wire table information 62 includes information such as the wire load or the length of the wires connected to output terminals. The PTV condition information 63 includes information, such as a standard temperature, a standard voltage, and the operating conditions.

Each piece of cell information 22b includes a cell setting parameter 64, a pin parameter 65, a function definition 66, and a timing definition 67. The tool setting parameter 64 includes a name, etc. shown on a tool. The pin parameter 65 includes information of a cell, such as the load and capacitance of a pin and whether a pin is for input or for output. The function definition 66 includes information of the functions of a cell (e.g., AND function). The timing definition 67 includes the delay information of an output relative to an input.

The processor 21 copies the information included in the reference library 22 and, among the information, rewrites the information related to the client's conditions in accordance therewith. For example, the processor 21 rewrites the tentative wire table information 62 and the PTV condition information 63 in the header 22a in accordance with the client conditions, and rewrites the values of the cell information 22b (e.g., delay time described in timing definition) with the characteristic data calculated from the client's conditions and the characteristic approximation function. This generates the verification library 25 in accordance with the client's conditions.

In the reference library 22 shown in FIG. 12, the maximum transition time (max-transition) included in the pin parameter of the cell information 22b is a fixed value, and the maximum capacitance (max-capacitance) included in the timing definition 67 is a fixed value. The processor 21 may rewrite these fixed values in accordance with values included in the characteristic extraction tables 26 or the client's conditions. The rewriting would enable the control parameters to be changed in any manner and improve the verification accuracy.

The first embodiment has the advantages described below.

(1) The library generation device 20 extracts a characteristic approximation function from the characteristic extraction table 26 and uses the characteristic approximation function to obtain characteristic data in accordance with the client's conditions. This easily generates a library in accordance with the client's demand.

Further, a value of the characteristic data obtained in accordance with the above polynomial function is smaller than the value obtained through a simulation, and the error between the two values is less than a predetermined value (e.g., five percent). This error is less than the error between a value obtained using a scaling factor in the prior art and a value obtained through a simulation. Further, in the first embodiment, the characteristic data is obtained from the characteristic extraction data. Thus, the problem of the prior art (negative characteristic value) when using the scaling factor is avoided. In addition, in the first embodiment, the power number of the polynomial function is determined as required so that the time required for determining the polynomial function is within a practical range.

(2) The library generation device 20 includes characteristic data generated in accordance with a characteristic approximation function and the formation information of the reference library 22. Further, the library generation device 20 generates the library with the same format as the reference library 22. Accordingly, by changing the reference library 22 to which reference is made, the format information and format of the newly generated library 25 is matched with the reference library 22. This enables the library generation device 20 to refer to the library prepared for each timing analysis tool and directly generate a library that is usable in each timing analysis tool.

(3) The characteristic approximation function is a polynomial function, and the power number of the characteristic approximation function is determined in accordance with the characteristic data. This facilitates the narrowing of an input parameter, enables quick determination of a characteristic approximation function, and enables generation of the verification library 25 within a short period of time.

(4) The characteristic extraction library 23 includes a basic table and an interpolation table. The number of points in the interpolation table (number of rows×number of columns) is less than that of the basic table. This decreases the data amount of the characteristic extraction library 23.

The characteristic approximation function is determined after interpolating two points and increasing the data of the interpolation table. This enables accurate calculation of the coefficient of the characteristic approximation function. As a result, characteristic data that is in accordance with the client's conditions is calculated with high accuracy.

(5) The library generation device 20 generates the verification library 25, which is readable by a timing analysis tool and does not generate the scaling file 14 of the prior art. That is, the verification library 25 is readable to a timing analysis tool that does not support a scaling file, and the library for verification may easily be applied when conducting a verification with such a timing analysis tool.

(6) The library generation device 20 sets the control parameters in accordance with the characteristic extraction library 23 or the input client conditions 24. The input capacitance that cannot be used as a scaling factor is changed in accordance with the client conditions 24 to enable accurate verification.

It should be apparent to those skilled in the art that the present invention may be embodied in many other specific forms without departing from the spirit or scope of the invention. Particularly, it should be understood that the present invention may be embodied in the following forms.

The format of the verification library 25 is not limited. The library generation device 20 generates the verification library 25 in the same format as the format of the reference library 22. Thus, when the reference library 22 is changed in accordance with the timing analysis tool, the timing analysis tool readable verification library 25 is generated accordingly. The library may be a scalable polynomial delay model (SPDM) or a non-linear delay model (NLDM).

The characteristic data of the reference library 22 may be rewritten by the characteristic data obtained through parameter calculation, and the rewritten reference library may be used as a library for verification. In this case, the reference library 22 and the verification library 25 do not have to be stored in two storage devices 33. Thus, the above processing may be performed even with a storage device 33 having a small capacity. In the first embodiment, the reference library 22 and the verification library 25 are stored in two storage devices 33. Thus, if one of the libraries is destroyed for one reason or another, format information may be acquired from the other one of the libraries. This increases the safety of the data.

To generate the verification library 25, operating conditions may be input in accordance with the type of semiconductor integrated circuit and reflected on the control parameters. For example, the maximum capacitance (max cap) may be calculated using a formula based on the leakage current in a cell and a current density criterion.

The verification library 25 may be generated without referring to the reference library 22. That is, the format information included in the reference library 22 may be generated. Alternatively, a new verification library 25 that includes format information may be generated. This would obtain the same advantages as the first embodiment.

In the first embodiment, when the condition setting range of the characteristic extraction table 26 includes the conditions of the characteristics of the reference library, the characteristic data of the reference library 22 may be extracted to generate a characteristic extraction table 26 (basic table). For example, in FIG. 9A, when the power worst condition in the reference library 22 is the temperature being 125° C. and the voltage being 1.3V, the characteristic data of the reference library 22 is extracted to generate the basic table. This would reduce the time for generating the characteristic extraction library 23.

Further, when the condition setting range of the characteristic extraction table 26 includes the conditions of the characteristics of the reference library 22, the characteristic table of the reference library 22 may be referred to as the basic table. That is, the characteristic extraction library 23 may include only five characteristic interpolation tables as the characteristic extraction tables 26, and the reference library 22 may be provided with the function of the characteristic extraction library 23. When inputting the characteristic extraction library 23 in the characteristic data input process of step S41 in FIG. 5, the processor 21 of FIG. 3 inputs the characteristic data of the reference library 22 and the data of the five characteristic interpolation tables of the characteristic extraction library. This decreases the data amount of the characteristic extraction library 23 and enables a storage device 33 having a smaller capacity to be used.

The present examples and embodiments are to be considered as illustrative and not restrictive, and the invention is not to be limited to the details given herein, but may be modified within the scope and equivalence of the appended claims.

What is claimed is:

1. A method for generating a library usable in designing a semiconductor integrated circuit device to verify the semiconductor integrated circuit device and that stores cell information including characteristic data representing a characteristic of a cell, which is included in the semiconductor integrated circuit device, corresponding to a client-designated operating condition that is included in and part of a guaranteed operation range of the semiconductor integrated circuit device, the method comprising:

generating a characteristic extraction library including the characteristic data corresponding to a range of operating conditions that covers the client-designated operating condition that is included in and part of a guaranteed operation range of the semiconductor integrated circuit device, wherein the characteristic extraction library is for extracting a characteristic value in the range based upon correlation between the characteristic of the cell and the range of operating conditions;

selecting the characteristic of the cell to be verified;

determining a characteristic approximation function corresponding to the client-designated operating condition and to the selected characteristic of the cell to be verified by referring to the characteristic extraction library;

calculating characteristic data corresponding to the client-designated operating condition in accordance with the characteristic approximation function that corresponds to the client-designated operating condition and to the selected characteristic of the cell to be verified; and generating the library corresponding to the client-designated operating condition and including the calculated characteristic data.

2. The method according to claim 1, wherein the characteristic approximation function is a polynomial function including a fixed power corresponding to the selected characteristic.

3. The method according to claim 2, wherein said determining a characteristic approximation function includes:

formularizing a matrix configured by the data of the characteristic extraction library; and solving the matrix to obtain a coefficient of the polynomial function.

4. The method according to claim 2, wherein the characteristic extraction library is one of a plurality of characteristic extraction tables.

5. The method according to claim 4, wherein said calculating of the characteristic data that corresponds to the client-designated operating condition includes calculating data corresponding to the client-designated operating condition in accordance with a predetermined polynomial function using data of the plurality of characteristic extraction tables.

6. The method according to claim 4, wherein each of the characteristic extraction tables stores at least six pieces of data, each corresponding to one of six operating conditions.

7. The method according to claim 4, wherein each of the plurality of characteristic extraction tables is a matrix including a plurality of rows and a plurality of columns, and at least one of the plurality of characteristic extraction tables is a basic table configured by rows and columns, the number of rows and columns corresponding to the selected characteristic, the product of the number of rows and the number of columns in each of the remaining characteristic extraction tables being less than the product of the number of rows and the number of columns in the basic table.

8. The method according to claim 7, wherein said determining a characteristic approximation function includes:

interpolating two points with the characteristic data stored in the characteristic extraction tables excluding the basic table to increase the number of pieces of characteristic data stored in each of the characteristic extraction tables excluding the basic table to the number of pieces of characteristic data stored in the basic table; and determining the characteristic approximation function from the increased number of pieces of characteristic data and the characteristic data stored in the basic table.

9. The method according to claim 1, wherein said generating a library includes:

referring to a reference library having a predetermined format and including header information and the characteristic data of the cell under a standard condition to generate a library having a format that is the same as the format of the reference library.

10. The method according to claim 2, wherein the fixed power is zero or greater, the polynomial function includes at least one coefficient, and said determining a characteristic approximation function includes determining the coefficient of the polynomial function.

11. A computer readable recording medium storing a program for generating a library usable in designing a semiconductor integrated circuit device to verify the semiconductor integrated circuit device and that stores cell information including characteristic data representing a characteristic of a cell, which is included in the semiconductor integrated circuit device, corresponding to a client-designated condition that is included in and part of a guaranteed operation range of the semiconductor integrated circuit device, by causing a computer to perform operations comprising:

generating a characteristic extraction library including the characteristic data corresponding to a range of operating conditions that covers the client-designated operating condition that is included in and part of a guaranteed operation range of the semiconductor integrated circuit device, wherein the characteristic extraction library is for extracting a characteristic value in the range based upon correlation between the characteristic of the cell and the range of operating conditions;

selecting the characteristic of the cell to be verified;

determining a characteristic approximation function corresponding to the client-designated operating condition and to the selected characteristic of the cell to be verified by referring to the characteristic extraction library;

calculating characteristic data corresponding to the client-designated operating condition using the characteristic approximation function that corresponds to the client-designated operating condition and to the selected characteristic of the cell to be verified; and generating the library corresponding to the client-designated operating condition and including the calculated characteristic data.

12. The computer readable recording medium according to claim 11, wherein the characteristic approximation function is a polynomial function including a fixed power corresponding to the selected characteristic, and said determining a characteristic approximation function includes:

formularizing a matrix configured by the data of the characteristic extraction library; and obtaining a coefficient of the polynomial function from the matrix.

13. The computer readable recording medium according to claim 12, wherein the characteristic extraction library is one of a plurality of characteristic extraction tables, and said calculating the characteristic data includes calculating data corresponding to the client-designated operating condition in accordance with a predetermined polynomial function using data of the plurality of characteristic extraction tables.

14. The computer readable recording medium according to claim 13, wherein each of the characteristic extraction tables stores at least six pieces of data, each corresponding to one of six operating conditions including four boundary operating conditions and two intermediate operating conditions between the boundary operating conditions.

15. The computer readable recording medium according to claim 13, wherein each of the plurality of characteristic extraction tables is a matrix including a plurality of rows and a plurality of columns, and at least one of the plurality of characteristic extraction tables is a basic table configured by rows and columns, the number of rows and columns corresponding to the selected characteristic, the product of the number of rows and the number of columns in each of the remaining characteristic extraction tables being less than the product of the number of rows and the number of columns in the basic table, wherein said determining a characteristic approximation function includes:

interpolating two points with the characteristic data stored in the characteristic extraction tables excluding the basic table to increase the number of pieces of characteristic data stored in each of the characteristic extraction tables excluding the basic table to the number of pieces of characteristic data stored in the basic table; and determining the characteristic approximation function from the increased number of pieces of characteristic data and the characteristic data stored in the basic table.

16. The computer readable recording medium according to claim 11, wherein said generating a library includes:

referring to a reference library having a predetermined format and including header information and the characteristic data of the cell under a standard condition to generate a library having a format that is the same as the format of the reference library.

\* \* \* \* \*